United States Patent
He et al.

(10) Patent No.: US 12,532,718 B2
(45) Date of Patent: Jan. 20, 2026

(54) IMPROVING SUBSTRATE WETTABILITY FOR PLATING OPERATIONS

(71) Applicant: Lam Research Corporation, Fremont, CA (US)

(72) Inventors: Zhian He, Lake Oswego, OR (US); Shantinath Ghongadi, Tigard, OR (US); Hyungjun Hur, Tigard, OR (US); Ludan Huang, King City, OR (US); Jingbin Feng, Lake Oswego, OR (US); Douglas Hill, Tigard, OR (US); Thomas Burke, Newberg, OR (US); Manish Ranjan, Sherwood, OR (US); Andrew James Pfau, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 293 days.

(21) Appl. No.: 17/051,432

(22) PCT Filed: Apr. 29, 2019

(86) PCT No.: PCT/US2019/029728
§ 371 (c)(1),
(2) Date: Oct. 28, 2020

(87) PCT Pub. No.: WO2019/212986
PCT Pub. Date: Nov. 7, 2019

(65) Prior Publication Data
US 2021/0366768 A1    Nov. 25, 2021

Related U.S. Application Data

(60) Provisional application No. 62/664,938, filed on Apr. 30, 2018.

(51) Int. Cl.
*H01L 21/768* (2006.01)
*H01L 21/285* (2006.01)

(52) U.S. Cl.
CPC .. H01L 21/76876 (2013.01); H01L 21/28562 (2013.01); H01L 21/76883 (2013.01)

(58) Field of Classification Search
CPC ......... H01L 21/76876; H01L 21/28562; H01L 21/76883; H01L 21/31051;
(Continued)

(56) References Cited

U.S. PATENT DOCUMENTS 5,043,299 A * 8/1991 Chang ............... H01L 21/76879
438/719
6,180,526 B1 * 1/2001 Chang ................. H01L 21/2885
438/692

(Continued)

FOREIGN PATENT DOCUMENTS

CN       100562372 C     11/2009
CN       102074486 A      5/2011

(Continued)

OTHER PUBLICATIONS

"International Application Serial No. PCT US2019 029728, International Preliminary Report on Patentability mailed Nov. 12, 2020", 8 pgs.

(Continued)

*Primary Examiner* — Dale E Page
*Assistant Examiner* — Quovaunda Jefferson
(74) *Attorney, Agent, or Firm* — Schwegman Lundberg & Woessner, P.A.

(57) ABSTRACT

Various embodiments include methods and apparatuses to moisturize a substrate prior to an electrochemical deposition process. In one embodiment, a method to control substrate wettability includes placing a substrate in a pre-treatment (Continued)

chamber, controlling an environment of the pre-treatment chamber to moisturize a surface of the substrate; and placing the substrate into a plating cell. Other methods and systems are disclosed.

26 Claims, 14 Drawing Sheets

(58) Field of Classification Search
CPC ............ H01L 21/32115; H01L 21/324; H01L 21/02315; H01L 21/02307; H01L 21/0226; H01L 21/02255; H01L 21/30625; H01L 21/2885; C25D 5/50; C25D 7/123; C25D 17/00; C25D 17/001
See application file for complete search history.

(56) References Cited

U.S. PATENT DOCUMENTS

| | | | |
|---|---|---|---|
| 6,297,154 B1 * | 10/2001 | Gross | H01L 21/2885 257/E21.585 |
| 6,518,183 B1 * | 2/2003 | Chang | H01L 21/76834 257/E21.582 |
| 7,066,703 B2 * | 6/2006 | Johnson | H01L 21/67196 414/217 |
| 7,256,111 B2 * | 8/2007 | Lopatin | H01L 21/6723 257/E21.174 |
| 7,632,758 B2 * | 12/2009 | Kitagawa | H01J 37/32192 438/758 |
| 7,964,506 B1 | 6/2011 | Ponnuswamy et al. | |
| 2005/0164497 A1 | 7/2005 | Lopatin et al. | |
| 2014/0197037 A1 | 7/2014 | Buckalew et al. | |
| 2014/0199497 A1 | 7/2014 | Spurlin et al. | |
| 2015/0179458 A1 * | 6/2015 | Mayer | H01L 21/76861 205/123 |

FOREIGN PATENT DOCUMENTS

| | | |
|---|---|---|
| CN | 112236847 | 4/2025 |
| KR | 20000017528 | 3/2000 |
| KR | 100256453 B1 | 5/2000 |
| KR | 20110044834 | 5/2011 |
| TW | I841561 | 5/2024 |
| TW | I865387 B | 12/2024 |

OTHER PUBLICATIONS

International Application Serial No. PCT/US2019/029728, International Search Report mailed Oct. 4, 2019, 4 pgs.
International Application Serial No. PCT/US2019/029728, Written Opinion mailed Oct. 4, 2019, 16 pgs.
Korean Application Serial No. 10-2020-7034357, Notice of Preliminary Rejection mailed Sep. 26, 2024, w/ English Translation, 11 pgs.
Korean Application Serial No. 10-2020-7034357, Response filed Nov. 26, 2024 to Notice of Preliminary Rejection mailed Sep. 26, 2024, W/English Claims, 17 pgs.
"Korean Application Serial No. 10-2020-7034357, Response filed Jul. 25, 2025 to Notice of Preliminary Rejection mailed May 27, 2025", W English Claims, (13 pages.).
Taiwanese Application Serial No. 108115053, Decision of Rejection mailed Apr. 17, 2023, w/o English Translation, 7 pgs.
Taiwanese Application Serial No. 108115053, Office Action mailed Jan. 16, 2023, w/ English Claims, 9 pgs.
Taiwanese Application Serial No. 108115053, Response filed Apr. 12, 2023 to Office Action mailed Jan. 16, 2023, w/ English claims, 7 pgs.
"Korean Application Serial No. 10-2020-7034357, Response filed Feb. 28, 2024 to Notice of Preliminary Rejection mailed Nov. 30, 2023", w current English claims, 27 pgs.
Chinese Application Serial No. 201980037211.3, Office Action mailed Jun. 24, 2024, w/ English translation, 17 pgs.
"Korean Application Serial No. 10-2020-7034357, Notice of Preliminary Rejection mailed Nov. 30, 2023", w English Claims, 16 pgs.
Korean Application Serial No. 10-2020-7034357, Notice of Preliminary Rejection mailed May 27, 2025, w/ English Translation, 8 pgs.

* cited by examiner

IMPROVING SUBSTRATE WETTABILITY FOR PLATING OPERATIONS

CLAIM OF PRIORITY

This application is a U.S. National-Phase Filing under 35 U.S.C. 371 from International Application No. PCT/US2019/029728, filed on 29 Apr. 2019, and published as WO 2019/212986 A1 on 7 Nov. 2019, which claims the benefit of priority to U.S. Provisional Patent Application Ser. No. 62/664,938, filed on 30 Apr. 2018, each of which is incorporated by reference herein in its entirety.

TECHNICAL FIELD

The subject matter disclosed herein relates to treating various types of substrates (e.g., silicon wafers or other elemental or compound wafers, or "wafers" in general) that have poor wettability, as a result of other process steps encountered prior to plating. Specifically, the disclosed subject matter improves wetting during substrate immersion into a plating bath and improves performance during an electrochemical plating process onto the substrate.

BACKGROUND

An electrochemical deposition process is commonly used for the metallization of an integrated circuit. In various processes, the deposition process involves depositing metal lines into trenches and vias that have been pre-formed in previously-formed dielectric layers. In this dependent process, a thin adherent metal diffusion-barrier film is generally pre-deposited onto the surface by utilizing physical vapor deposition (PVD) chemical vapor deposition (CVD) processes. Depending on the target metal film, a metal-seed layer will subsequently be deposited on top of the barrier film. The features (vias and trenches) are then electrochemically filled with a target metal through an electrochemical deposition process.

However, the performance of an electrochemical deposition onto substrates is impacted by many factors. For example, the plating bath composition, including both inorganic component concentrations and additive concentrations, have a significant role in ensuring void-free gap fill. The way in which the substrates enter into the plating solution (e.g., a time it takes to fully immerse the cathode/substrate into the plating solution, an angle at which the cathode/substrate enters the solution, a rotating speed of the cathode/substrate during immersion, etc.), as well as the current and voltage applied to the substrate, can play significant roles in the gap-fill quality and gap-fill uniformity across the substrate.

Various aspects regarding the initial immersion of cathode/substrate into the plating solution are known to a person of ordinary skill in the art. One aspect that plays a significant role is the wettability of the substrate by the plating bath during entry. Without proper wetting, air bubbles, for example, could stick to the surface of the substrate at certain areas, and the electrodeposition thereafter in the area impacted by the bubbles would be difficult to achieve due to an electrical discontinuity. The end result is missing plating in these areas. The defects associated with this poor wettability is referred to generally as "missing metal" defects. The missing metal defects frequently produce "killer defects" to areas containing active devices on the substrate. For example, FIGS. 1A and 1B show typical defect maps as a result of poor wetting of the substrate under methods of the prior art. The darker areas of FIGS. 1A and 1B indicate high areal-concentrations of defects. FIGS. 2A through 2C show typical defect shapes at progressively smaller fields-of-view (FOV) on a surface of a substrate as a result of poor wetting. FIG. 2A shows defects at an FOV of about 98 μm, FIG. 2B shows defects at an FOV of about 11.25 μm, and FIG. 2C shows defects at an FOV of about 3 μm.

As described above, for an electrochemical plating process, a thin adherent metal diffusion-barrier film is generally pre-deposited onto the surface by utilizing, for example, physical vapor deposition (PVD) or chemical vapor deposition (CVD) techniques. Depending on the target metal film, a metal-seed layer may then be deposited on the top of the barrier film. In general, a period of time from when the barrier layer and seed layer are deposited on the substrate to a time when the substrate is to be electrochemically deposited creates a time difference ($\Delta t$, referred to as "queue time"). During the queue time, a surface condition of the substrate is expected to change over time. One of the most widely perceived surface changes is the oxidation of the metal layer on the substrate. The oxidation of the surface metal increases the sheet resistance of the seed layer, thereby making it more difficult to plate uniformly onto the seed layer due to a stronger terminal effect. The oxide layer changes the additive absorption behavior on the seed layer and could lead to various plating problems. The oxide layer also changes the wetting behavior during substrate immersion. The oxide, if not reduced back to metal before plating, dissolves into the plating bath, and subsequently may lead to a loss in the seed layer and additional problems known to a person of ordinary skill in the art. Further, the oxidation of the metal-seed layer is usually not uniform across the substrate. Consequently, there is typically a strong dependence on queue time to non-uniformity. Thus, oxidation to the substrate during queue time introduces variations into the plating process performance, and the oxidation is generally detrimental to the plating process.

To remove or reduce an impact of the queue time, and to ensure process performance, various approaches have been taken in the semiconductor and related industries to address the seed-layer oxidation issue. One such method is to contain the substrates in an environmentally-controlled, front-opening unified pod (FOUP), subsequent to seeding and prior to plating. In this example, the FOUP is usually filled with nitrogen ($N_2$), to prevent oxygen ($O_2$) from reaching the substrate, whereby the $O_2$ oxidizes the seed, as shown in FIG. 3A.

FIG. 3A shows a method 300 of the prior art used to reduce oxidation on a plating apparatus, which is followed by various depositions, cleaning, and post-anneal operations. The method 300 shows an operation in which an incoming seed substrate is in a FOUP, comprising an $N_2$-environment. The substrate is then transferred to a plating cell to undergo an electrochemical deposition. After the electrochemical deposition is completed, the substrate is then transferred to a post-plating chamber to be cleaned and dried. In a subsequent operation, the substrate is then transferred to an anneal chamber for a post-anneal process. Once all operations shown are completed, the substrate is then transferred back to the FOUP.

With reference now to FIG. 3B, a second method 310 of the prior art used to address the seed-layer oxidation issue is to reduce the surface oxide in a hydrogen ($H_2$) environment, at an elevated temperature. The method 310 shows an operation in which an incoming seed substrate is in a FOUP. The substrate is transferred from the FOUP to a pre-plating anneal process in which the substrate undergoes the anneal process n forming gas with $H_2$. The substrate is then transferred to a plating cell to undergo an electrochemical deposition. After the electrochemical deposition is completed, the substrate is then transferred to a post-plating chamber to be cleaned and dried. In a subsequent operation, the substrate is then transferred to an anneal chamber for a post-anneal process. Once all operations shown are completed, the substrate is then transferred back to the FOUP. This $H_2$-based process is typically referred to as a pre-anneal process and needs to be performed immediately prior to the plating process.

FIG. 3C shows a third method 330 of the prior art used to address the seed-layer oxidation issue. The third method 300 reduces a surface oxide in an $H_2$, plasma-based environment, with hydrogen (H) radicals. The method 330 shows an operation in which an incoming seed substrate is in an FOUP. The substrate is transferred from the FOUP to a pre-treatment chamber in which the substrate is placed under vacuum in an $H_2$, plasma-based environment at an elevated temperature. The substrate is then transferred to a plating cell to undergo an electrochemical deposition. After the electrochemical deposition is completed, the substrate is then transferred to a post-plating chamber to be cleaned and dried. In a subsequent operation, the substrate is then transferred to an anneal chamber for a post-anneal process. Once all operations shown are completed, the substrate is then transferred back to the FOUP. This $H_2$, plasma-based process is typically referred to as a pre-anneal process and needs to be performed immediately prior to the plating process. Similar to the pre-anneal process, this $H_2$, plasma-based process is often performed immediately prior to the plating process. However, this process may be performed at a significantly lower temperature than with the pre-anneal processes discussed above with reference to FIGS. 3A and 3B. As reported in the literature and known to a person of ordinary skill in the art, the $H_2$, plasma-based process is also capable of cleaning the surface layer and removing many impurities in the seed layer.

In some applications, however, it had been observed that the above-mentioned prior art approaches and processes to prevent oxidation, or to reduce a formed metal-oxide back into metal, could introduce other issues in a subsequent plating process. For example, containing the substrates in an $N_2$-filled FOUP for an extended period of time has been found generally to be effective in preventing oxidation from occurring. Yet, it was also found that the substrate could then become very difficult to wet in a subsequent plating process. Similarly, a pre-anneal process, or a pre-reduction process in an $H_2$, plasma-based process, had also been found to degrade the wettability of the seed substrate during plating, thereby causing missing-plating defects during plating. Without being properly addressed, the above processes and approaches to control, reduce, or eliminate surface metal-oxides could not be implemented successfully.

The information described in this section is provided to offer the skilled artisan a context for the following disclosed subject matter and should not be considered as admitted prior art.

DETAILED DESCRIPTION

Figure 1B:
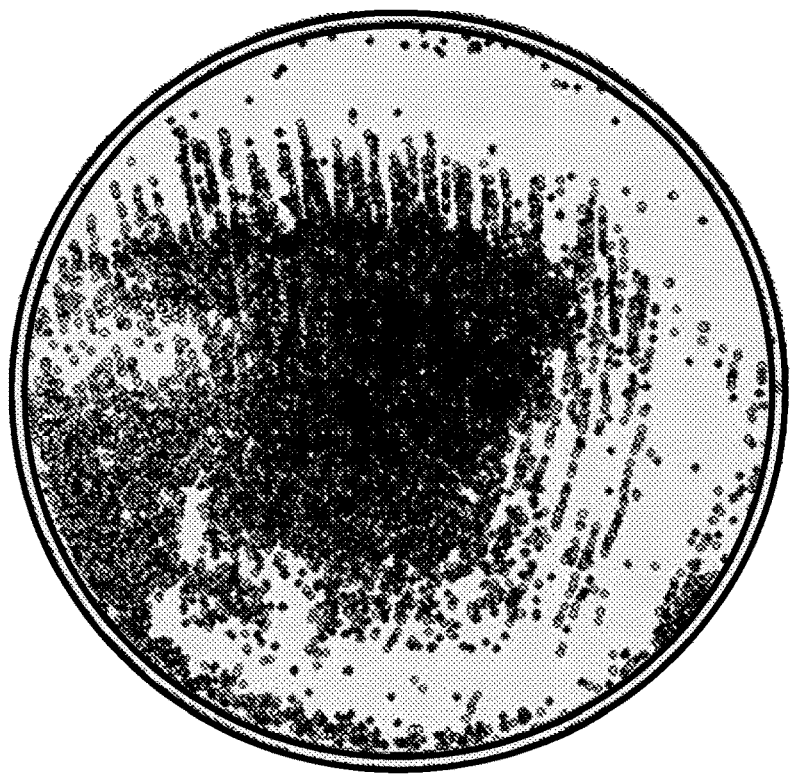
FIGS. 1A and 1B show typical defect maps of the prior art as a result of poor wetting of the substrate.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

The disclosed subject matter contained herein describes various embodiments to improve substrate wettability. While, as discussed above, various substrate-entry processes of the prior art have been found to have a limited improvement on substrate wettability. Consequently, these prior art processes only partially improve the problem with missing plating-defects caused by poor wetting.

As disclosed herein, the substrate-wettability issue could be resolved more fully by moisturizing a surface of the substrate substantially immediately before a subsequent electrochemical plating process (see, FIG. 7B describing adsorption mechanisms and accompanying verbiage, below). Upon reading and understanding the disclosure provided herein, a person of ordinary skill in the art will recognize that each of the various embodiments disclosed herein are different from a pre-wet process of the prior art.

For example, for certain electrochemical-plating applications, substrates cannot be wetted fully. Features on the substrate may otherwise be filled with deionized (DI) water by a pre-wetting process. A subsequent electrochemical-plating process inside the features is then impacted due to the DI water occupying (e.g., filling or partially filling) some or all of the features. The following disclosed subject matter helps generate a uniformly or substantially uniformly moisturized surface for good wetting behavior during plating, without filling the features with excessive DI, thereby improving the wetting without compromising the performances of a subsequent plating process.

In various embodiments, a natural moisturizing process of surface of a substrate prior to a plating process is disclosed. In general, natural moisturizing involves using moisture in an environment of the plating tool to moisturize the surface of the substrate. Natural moisturizing can be implemented by, for example, introducing a "waiting step" in the process sequence prior to (e.g., substantially immediately prior to) plating in various locations in the plating apparatus prior to the plating cell, or in the plating cell itself. The period-of-time in the waiting step depends on a number of factors such as the nature of the substrate (including any films already formed thereon) such that the substrate is, for example, hydroscopic or hydrophobic, the relative humidity of the "waiting volume," and other factors that are known or can be known to a person of ordinary skill in the art. Once such factors are known, the skilled artisan can then determine a time period (and other factors such as a partial pressure of an $H_2O$ vapor or a relative humidity in the waiting volume, temperatures, etc.) for the waiting step based on thermodynamics and chemical-absorption principles.

For example, in natural moisturizing, the substrate could be waiting on an end effector of a robotic arm prior to placing the substrate inside the plating cell; waiting in a FOUP that is exposed to air subsequent to other process sequences (such as pre-anneal, treated in $H_2$ plasma, etc.); and/or waiting inside a process module that is exposed to air before the plating cell while on a stacking station. As noted above, the delay time needed depends at least partially on the relative humidity and other factors in the environment at respective locations. However, depending on the implementation, the waiting time with this natural moisturizing approach could be significant enough to cause backlog and potential throughput issues on the plating apparatus, and sometimes even cause difficulties in sequencing a substrate run. On the other hand, waiting in the plating cell was found to be very feasible, and a waiting time of from about 5 seconds to about 30 seconds has been found to be able to fully moisturize the substrate, thereby fully or substantially mitigating the poor wettability problem with the original substrates as noted under the prior art.

In various embodiments, an accelerated/controlled moisturizing of a surface of a substrate prior to a plating process is also disclosed. In general, with the accelerated/controlled moisturizing embodiments, the substrates may be exposed to a controlled environment.

For example, due to the dependency of the moisturizing process on the relative humidity inside the plating apparatus, the potential of oxidation of the metal surface by the $O_2$ in the environment, and the time needed for the substrate to absorb moisture from the environment, the substrate may be exposed to a controlled environment in various embodiments. The controlled environment may be, for example, an oxygen-free or oxygen-modulated environment to prevent or reduce excess surface oxidation (see, e.g., FIG. 4A). With concurrent reference to one or more of the drawings of FIGS. 4A through 4D, potential embodiments include but are not limited to: (a) a substrate exposed to humidified $N_2$ in a plating cell, provided through a nozzle; (b) a substrate exposed to humidified $N_2$ in a stacking/parking station prior to a plating module; (c) substrate exposed to humidified $N_2$ in a FOUP; (d) a substrate exposed to humidified $N_2$ in any process module as needed prior to the plating module; (e) a substrate exposed to water vapor in any process module (including but not limited to vacuum modules, vacuum/atmospheric transition modules, or atmosphere modules) as needed prior to the plating module; and/or f) any of the above embodiments implemented in a standalone module (instead of on a plating apparatus). Detailed descriptions are provided for each of these and more processes below. Although various embodiments disclosed herein may refer to substrates being located in a FOUP during various stages of the operations, the substrates may also be located in another environment such as various types of substrate stations, substrate cassettes, substrate holding locations, and other types of locations and apparatuses. Therefore, such types of locations, which may comprise, for example, $N_2$, DI, and/or oxygen-free environments, may simply be referred to herein as "substrate environments." Further, although the various embodiments are described with reference to a plating operation, the disclosed subject matter is not so limited and the embodiments may be applied for a variety of different methods, processes, and operations.

Figure 4A:
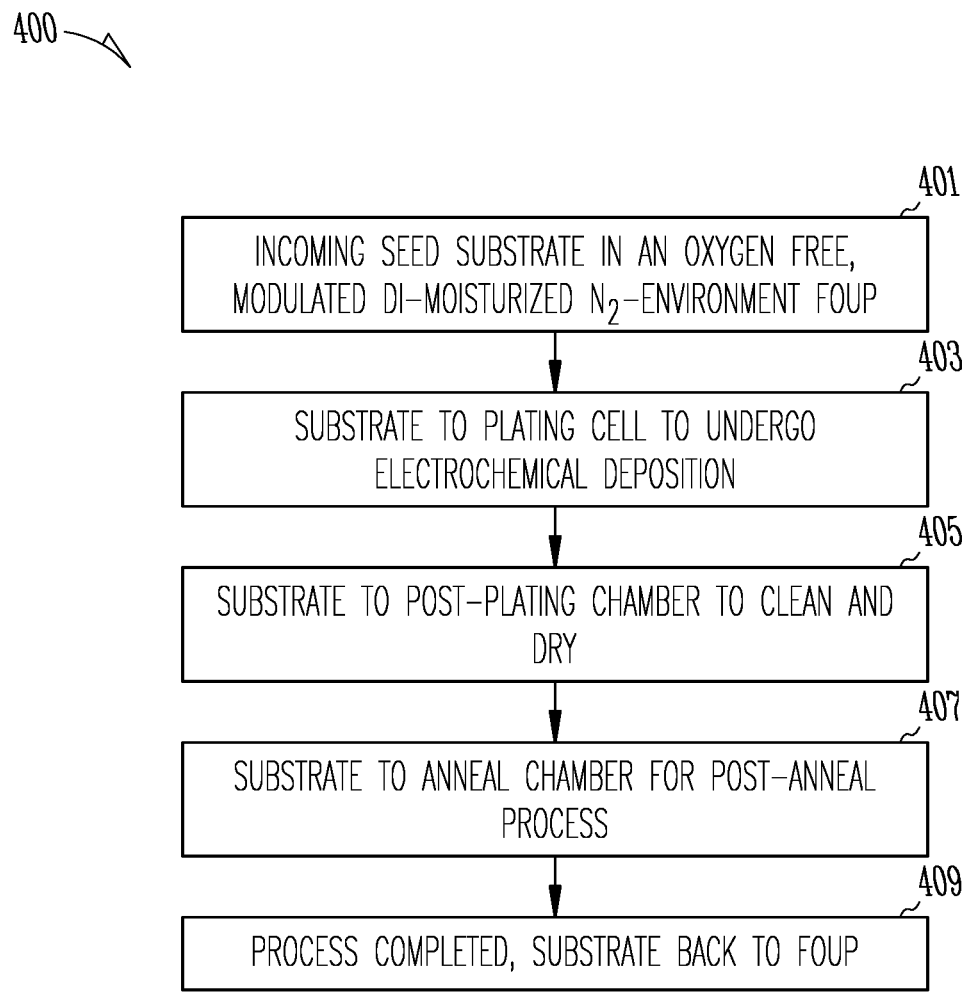
FIGS. 4A through 4D show examples of various techniques used to reduce or eliminate oxidation and increase wettability on a plating apparatus in accordance with various embodiments disclosed herein, at least some of the examples of the various techniques are followed by various depositions, cleaning, and post-anneal operations.

For example, with reference now to FIG. 4A, an exemplary embodiment of a method 400 to reduce or eliminate oxidation, while concurrently or substantially concurrently increasing wettability of a substrate in a plating apparatus, is shown. The method 400 shows an operation 401 in which an incoming seed substrate (a substrate having a meta-see layer formed thereon) is in a substantially oxygen-free, modulated DI-moisturized FOUP environment, with the FOUP comprising an $N_2$-environment.

The modulated DI-moisturized FOUP environment refers to, for example, an environment with a controlled relative-humidity (RH) range of about 20% to about 100%. The substrate may remain in this environment for a wide variety of times based on factors such as upstream processes, process requirements, tool availability, a desired substrate-throughput rate, and various other factors. Therefore, a time in the modulated DI-moisturized FOUP environment may be from a few seconds to as long as several hours for a given process. Consequently, the RH range and times given are exemplary only and may vary considerably for a particular process. Further, as noted above, in various embodiments described herein, a person of ordinary skill in the art will recognize that the substrate may be in various environments other than a FOUP (e.g., the substrate environment). Therefore, the environment being within the FOUP is provided merely as an example in which the stated environments can occur.

With continuing reference to FIG. 4A, at operation 403, the substrate is then transferred to a plating cell to undergo an electrochemical deposition. After the electrochemical deposition is completed, the substrate is then transferred, at operation 405, to a post-plating chamber for the substrate to be cleaned and dried. In a subsequent operation 407, the substrate is then transferred to an anneal chamber for a post-anneal process. In various examples, a post-anneal process may comprise annealing the substrate at a range of from about 30° C., to about 400° C. for approximately 30 seconds to about 600 seconds, with a cooling period of from about 30 seconds to about 600 seconds. However, these times and temperatures are given as an example only and may vary considerably in both times and temperatures for a particular process. Once all operations shown are completed, the substrate is then transferred back to the FOUP at operation 409.

Figure 4B:
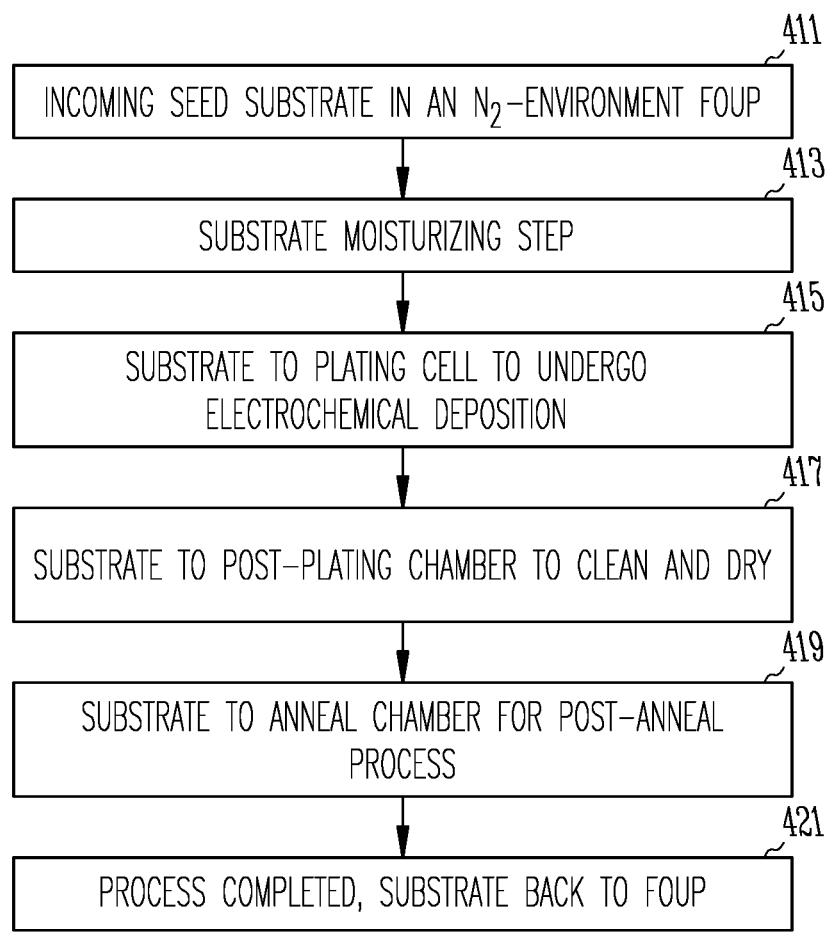

In FIG. 4B, another exemplary embodiment of a method 410 to reduce or eliminate oxidation, while concurrently or substantially concurrently increasing wettability of a substrate in a plating apparatus, is shown. The method 410 shows an operation 411 in which an incoming seed substrate is in a FOUP, with the FOUP comprising an $N_2$-based environment. At operation 413, the substrate is subjected to a substrate-moisturizing step in accordance with various embodiments described herein. At operation 415, the substrate is then transferred to a plating cell to undergo an electrochemical deposition. After the electrochemical deposition is completed, the substrate is then transferred, at operation 417, to a post-plating chamber for the substrate to be cleaned and dried. In a subsequent operation 419, the substrate is then transferred to an anneal chamber for a post-anneal process. The post-anneal process may the same as or similar to the parameters given with reference to FIG. 4A. Once all operations shown are completed, the substrate is then transferred back to the FOUP at operation 421.

Figure 4C:
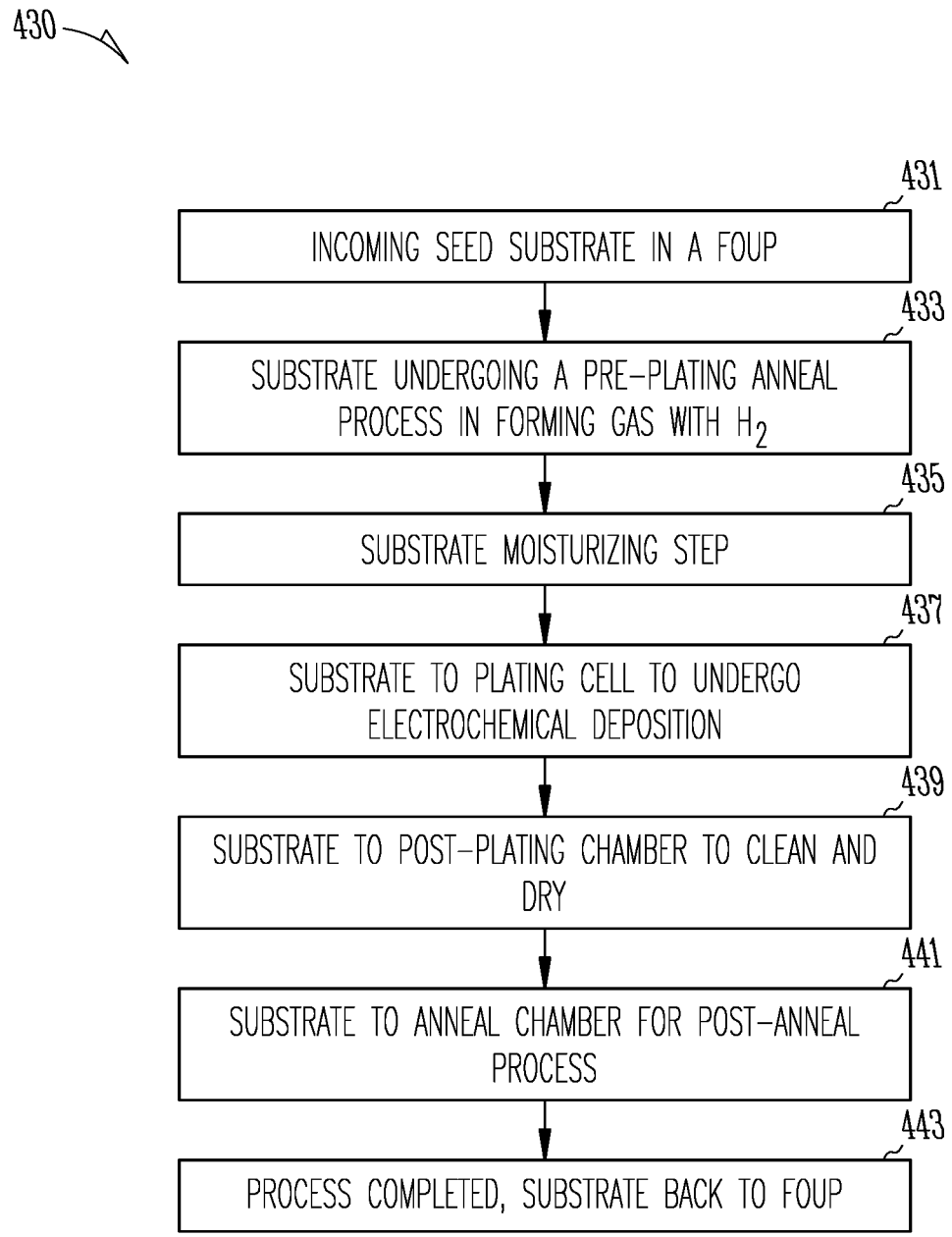

In FIG. 4C, another exemplary embodiment of a method 30 to reduce or eliminate oxidation, while concurrently or substantially concurrently increasing wettability of a substrate in a plating apparatus, is shown. The method 430 shows an operation 431 in which an incoming seed substrate is in a FOUP. In some embodiments, the FOUP does not necessarily comprise an $N_2$-based environment. In other embodiments, the FOUP comprises an $N_2$-based environment. At operation 433, the substrate undergoes a pre-plating anneal process in a forming gas with hydrogen ($H_2$). In various examples, a pre-anneal process may comprise annealing the substrate at a range of from about 30° C. to about 400° C. for approximately 30 seconds to about 600 seconds, with a cooling period of from about 30 seconds to about 600 seconds. However, these times and temperatures are given as examples only and may vary considerably in both time and/or temperature for a particular process. Also, as noted the pre-anneal process may include a forming gas of $H_2$, which may be mixed with $N_2$. In embodiments, the $H_2$ may be mixed with $N_2$ and helium (He). An $H_2$ flow percentage of the total forming gas may be about, for example, at about 4% or less. However, this $H_2$ flow percentage is given as an example only and may vary considerably for a particular process. At operation 435, the substrate is subjected to a substrate-moisturizing step in accordance with various embodiments described herein. At operation 437, the substrate is then transferred to a plating cell to undergo an electrochemical deposition. After the electrochemical deposition is completed, the substrate is then transferred, at operation 439, to a post-plating chamber for the substrate to be cleaned and dried. In a subsequent operation 441, the substrate is then transferred to an anneal chamber for a post-anneal process. The post-anneal process may the same as or similar to the parameters given with reference to FIG. 4A. Once all operations shown are completed, the substrate is then transferred back to the FOUP at operation 443.

Figure 4D:
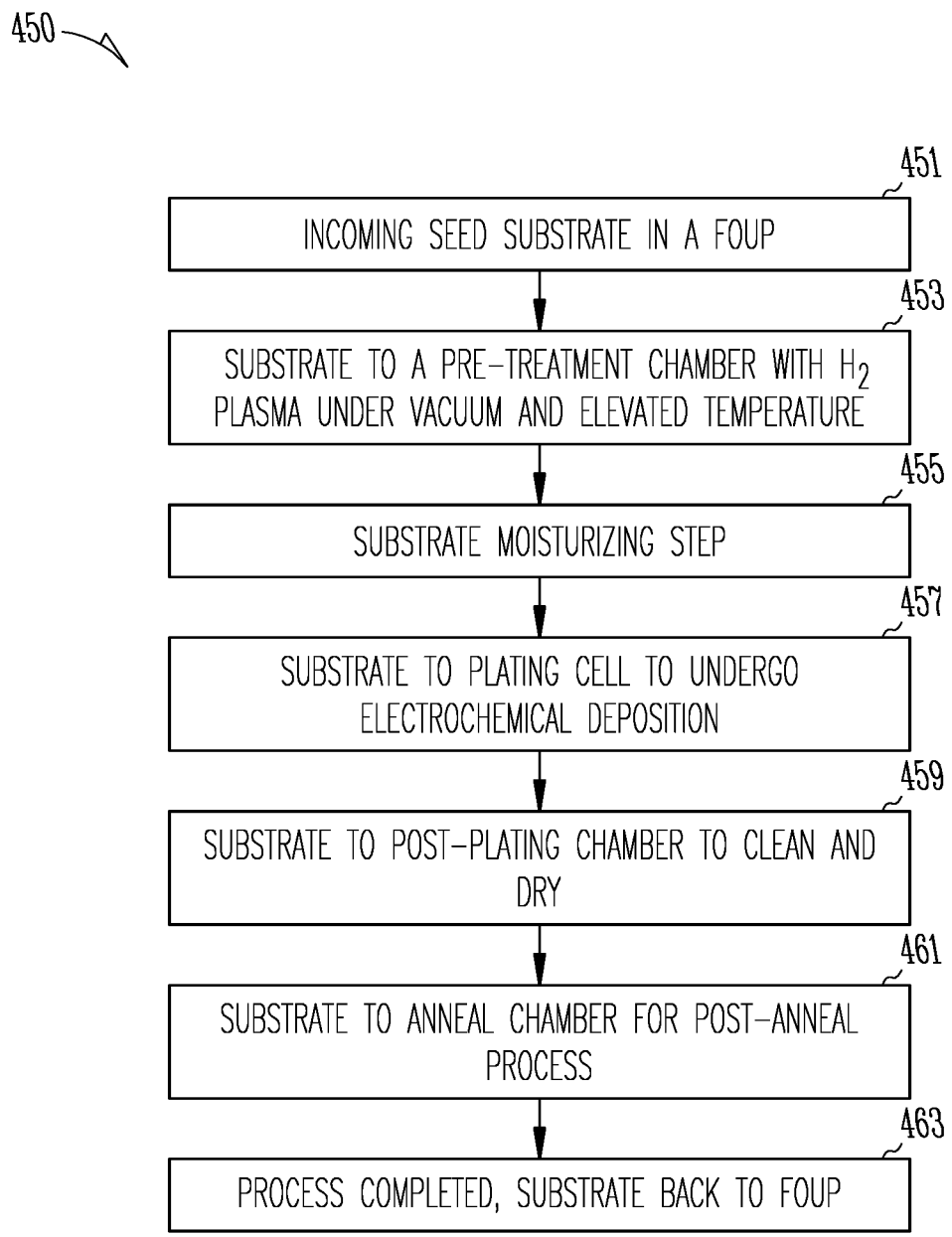

Referring now to FIG. 4D, another exemplary embodiment of a method 450 to reduce or eliminate oxidation, while concurrently or substantially concurrently increasing wettability of a substrate in a plating apparatus, is shown. The method 450 shows an operation 451 in which an incoming seed substrate is in a FOUP. In some embodiments, the FOUP does not necessarily comprise an $N_2$-based environment. In other embodiments, the FOUP comprises an $N_2$-based environment. At operation 453, the substrate is transferred to a pre-treatment chamber with $H_2$ plasma under vacuum and elevated temperature. In various embodiments, a vacuum level may be from about 0.1 Torr to about 5 Torr. A range of elevated temperature may be from, for example, about 30° C. to about 400° C. to enhance radical formation with the plasma so as to increase an efficiency of pre-treatment of the substrate. In various examples, a process time within the pre-treatment chamber may be from, for example, about 30 seconds to about 600 seconds. However, these vacuum levels, temperatures, and times are given as examples only and may vary considerably in one or more of vacuum level, temperature, and time for a particular process. At operation 455, the substrate is subjected to a substrate-moisturizing step in accordance with various embodiments described herein. At operation 457, the substrate is then transferred to a plating cell to undergo an electrochemical deposition.

After the electrochemical deposition is completed, the substrate is then transferred, at operation 459, to a post-plating chamber to be cleaned and dried. In a subsequent operation 461, the substrate is then transferred to an anneal chamber for a post-anneal process. The post-anneal process may the same as or similar to the parameters given with reference to FIG. 4A. Once all operations shown are completed, the substrate is then transferred back to the FOUP at operation 463.

Figure 1A:
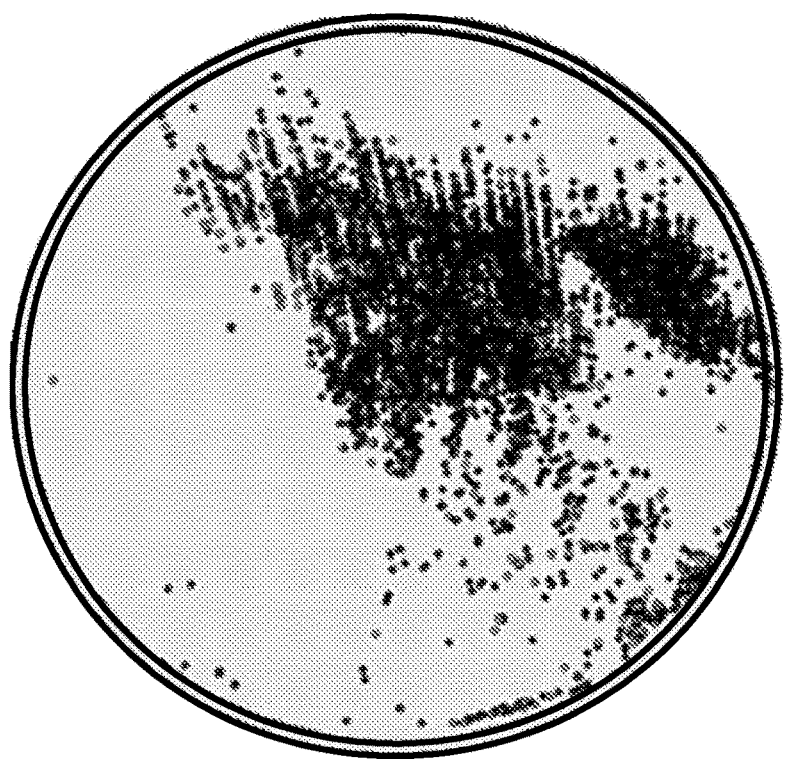
Figure 2C:
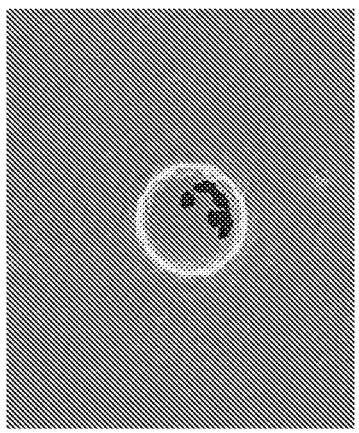
FIGS. 2A through 2C show typical defect shapes at different fields-of-view (FOV) on a surface of a substrate as a result of poor wetting processes of the prior art.
Figure 2C:
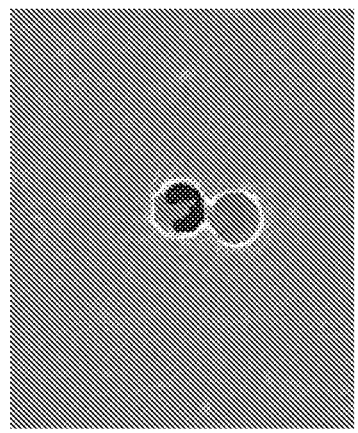
Figure 2B:
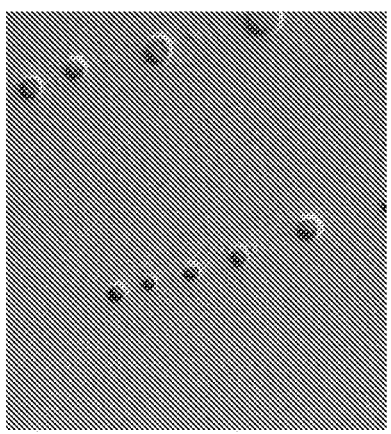
Figure 2B:
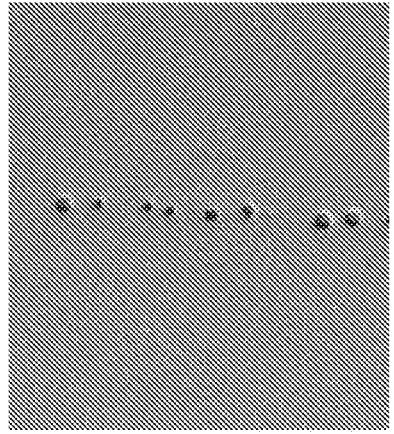
Figure 2A:
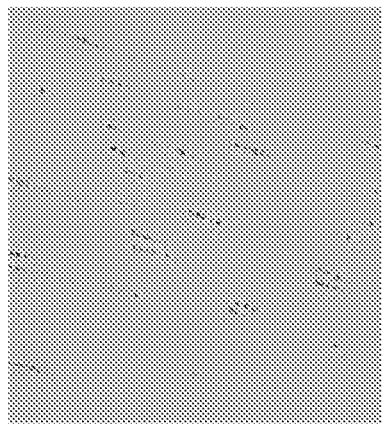
Figure 2A:
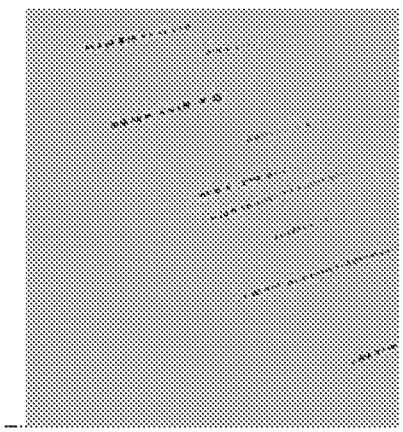
Figure 3A:
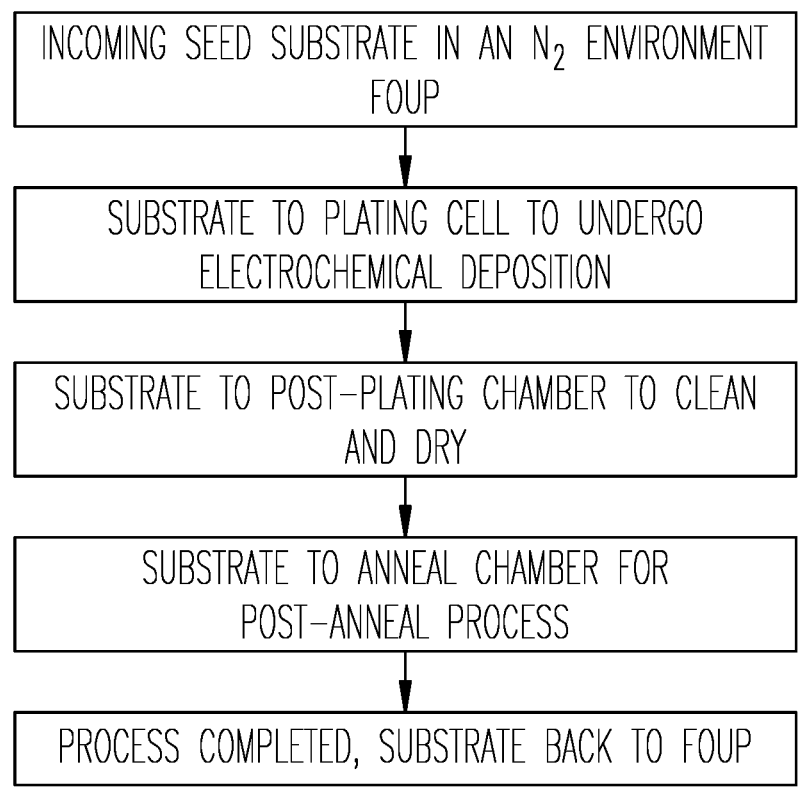
FIGS. 3A through 3C show examples of various methods of the prior art that have been used to reduce oxidation on a plating apparatus followed by various depositions, cleaning, and post-anneal operations.
Figure 3B:
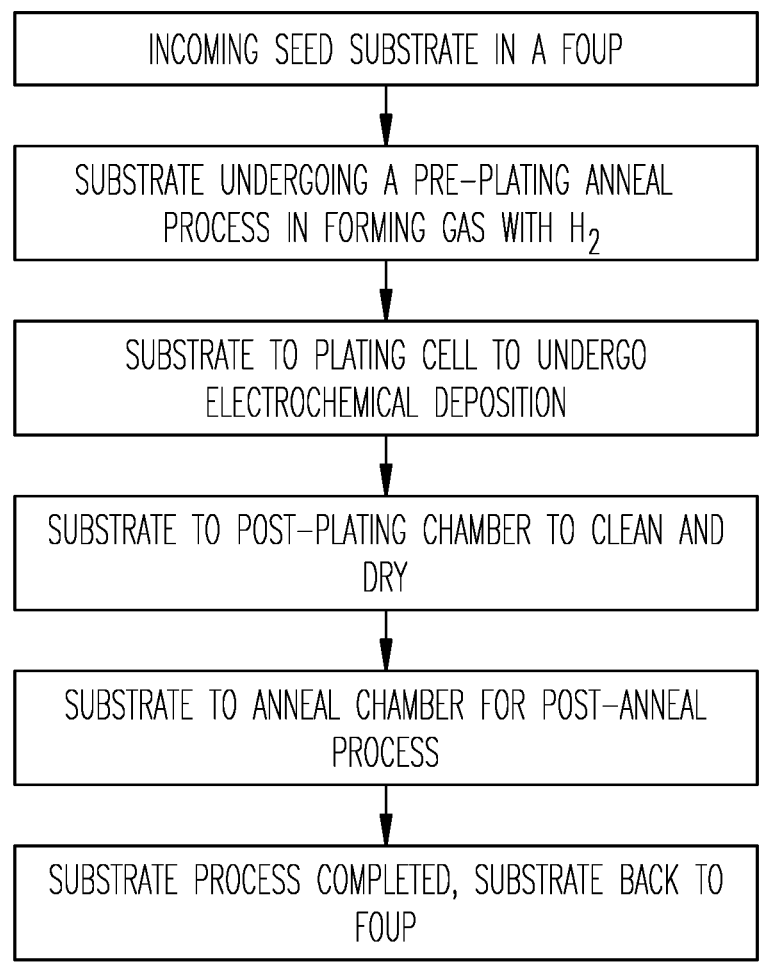
Figure 3C:
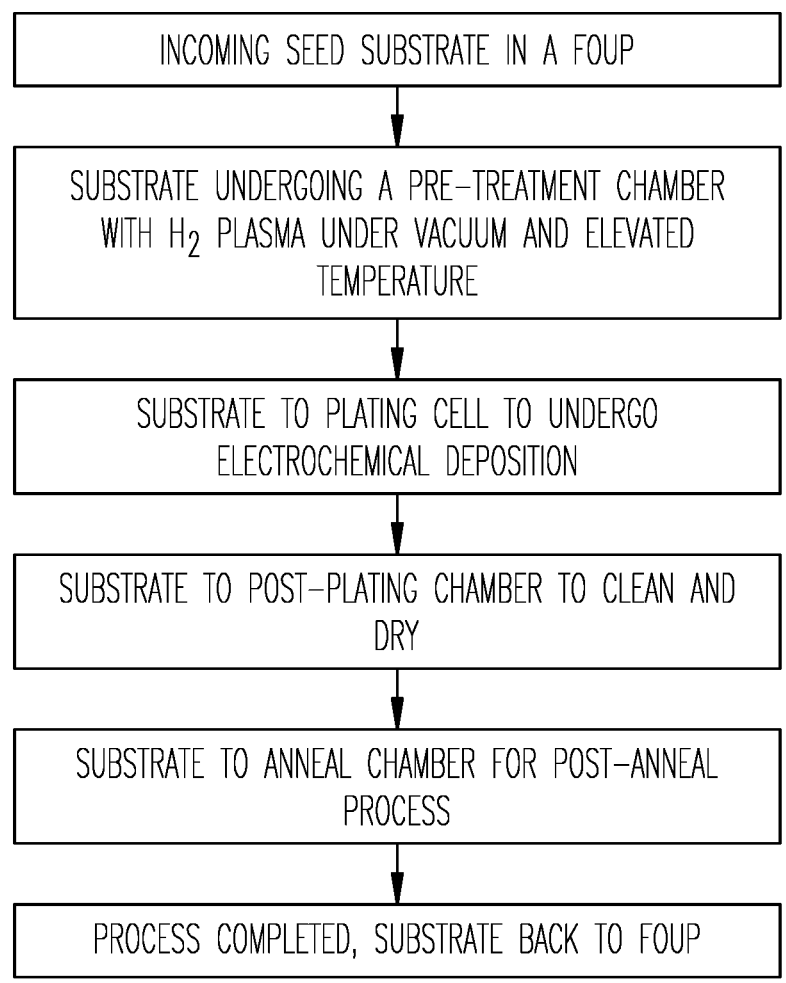
Figure 5:
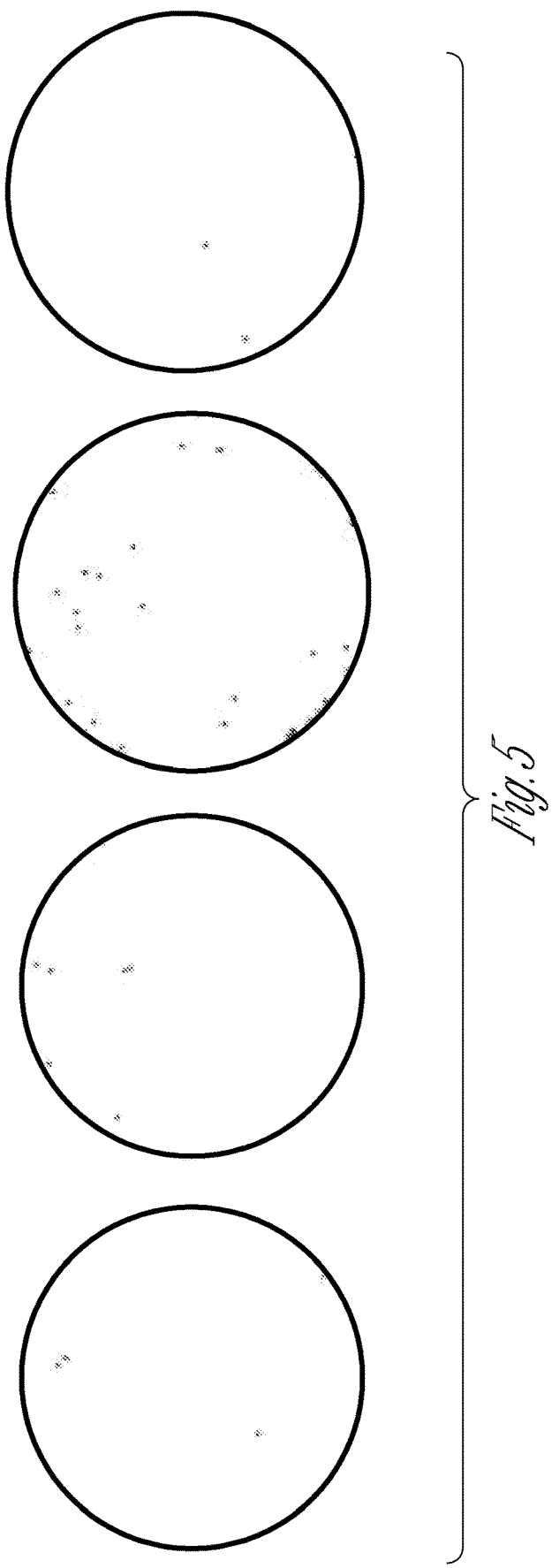
FIG. 5 shows an example of typical resulting defect maps after application of one or more of the various embodiments disclosed herein.

FIG. 5 shows an example of typical resulting defect maps after application of one or more of the various embodiments disclosed herein (e.g., the exemplary embodiments of the methods disclosed above with reference to FIGS. 4A through 4D). In comparison with FIGS. 1A and 1B, that show typical defect maps as a result of poor wetting of the substrate under methods of the prior art, a person of ordinary skill in the art will readily appreciate the significant reduction in defects as a result of an application of one or more of the various embodiments disclosed herein. Each of the defect maps of the substrates in both FIGS. 1A and 1B was taken at the same defect level (e.g., the same sensitivity level), with the same or a similar type of metrology tool, as the resulting defect maps of FIG. 5.

Figure 6A:
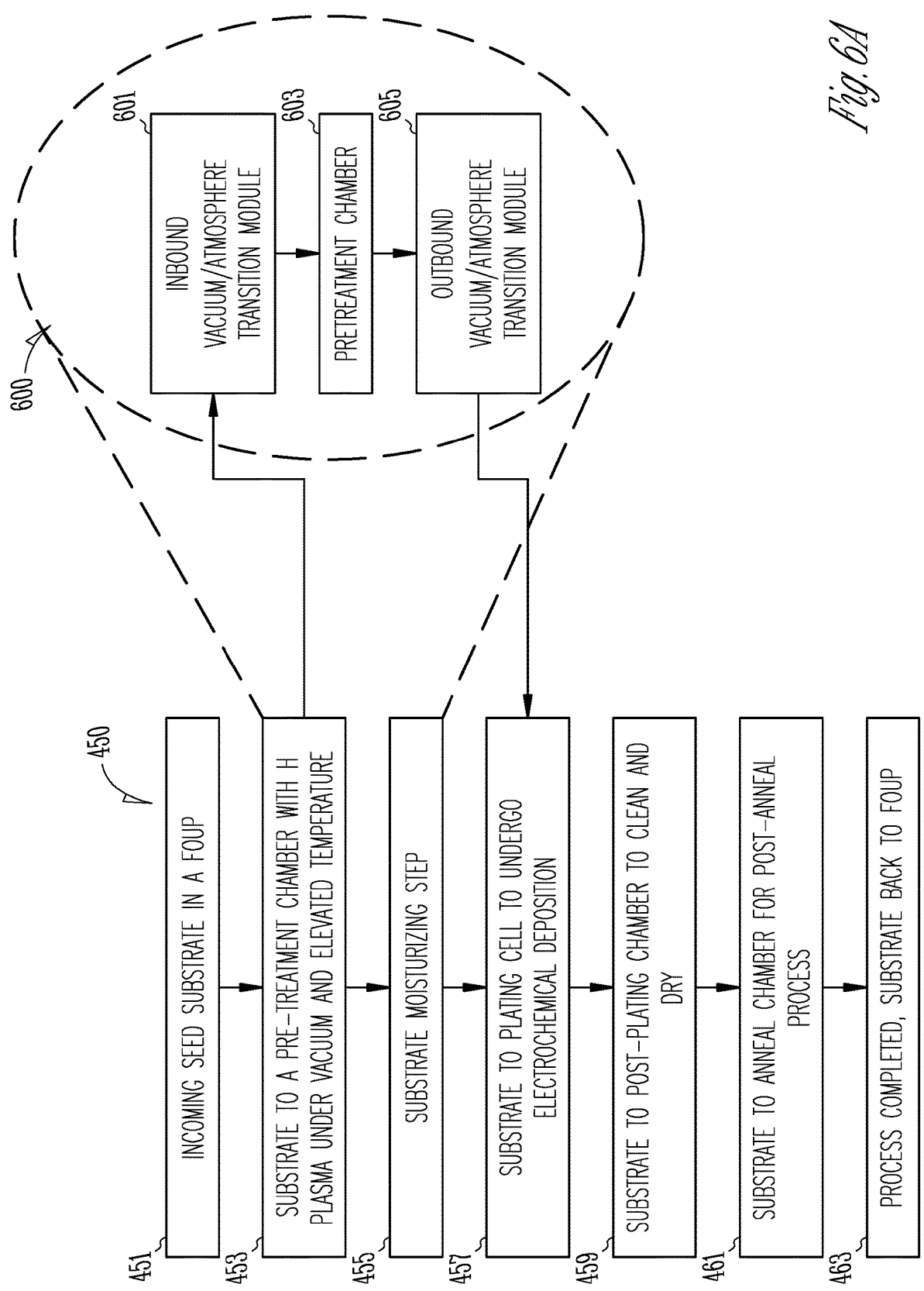
FIG. 6A shows an exemplary embodiment for environmental control of the substrate in a vacuum/atmospheric transition module.

FIG. 6A shows an exemplary embodiment for environmental control of the substrate in a vacuum/atmospheric transition module. With concurrent reference to FIG. 4D, the additional exemplary method 600 of FIG. 6A includes an operation 601 in which the substrate is transferred to an inbound vacuum/atmospheric transition module. The substrate is then transferred, at operation 603, to a pre-treatment chamber. In various embodiments, the pre-treatment chamber may comprise an $H_2$-plasma process under vacuum as noted above. In various embodiments, a vacuum level of the $H_2$-plasma process in the pre-treatment chamber may be from about 0.1 Torr to about 5 Torr. A range of temperatures may be applied and may be from, for example, about 30° C. to about 400° C. to enhance radical formation with the plasma so as to increase an efficiency of pre-treatment of the substrate. In various examples, a process time within the pre-treatment chamber may be from, for example, about 30 seconds to about 600 seconds. However, these vacuum levels, temperatures, and times are given as examples only and may vary considerably in one or more of vacuum level, temperature, and time for a particular process.

After a delay in the pre-treatment chamber at operation 603, the substrate is transferred to an outbound vacuum/atmospheric transition module at operation 605. The substrate remains in the outbound vacuum/atmospheric transition module for a period of time to transition from the vacuum conditions of the pre-treatment chamber to approximately atmospheric pressure.

At least a portion of the moisturizing step at operation 455 occurs in the outbound vacuum/atmospheric transition module. For example, in a specific exemplary embodiment, water ($H_2O$) vapor is supplied in the outbound vacuum/atmospheric transition module to increase $H_2O$ vapor adsorption on a surface of the substrate. In various embodiments, this adsorption may be facilitated further by a hydroxide ($OH^-$) layer. As is known to a person of ordinary skill in the art, hydroxide is a minor constituent of water and is a diatomic anion comprising an oxygen and hydrogen atom, coupled by a covalent bond. The hydroxide molecule generally carries a negative charge.

Continuing with this specific exemplary embodiment, the partial pressure of $H_2O$ is greater than 0 but less than water-vapor equilibrium. A pressure inside the outbound vacuum/atmospheric transition module is in a range of, for example, 1 Torr to 20 Torr at a temperature of approximately 20° C., although other pressures and temperatures may be suitable as well. A temperature of the $H_2O$ vapor may be in a range from about 10° C. to about 90° C. In accordance with other factors discussed herein, the substrate may have a delay time in the $H_2O$ vapor from about, for example, 10 seconds to about 1200 seconds.

After the delay time in the outbound vacuum/atmospheric transition module at operation 605, the substrate is transferred back to the plating cell at operation 457. Upon reading and understanding the disclosed subject matter, a person of ordinary skill in the art will recognize that the inbound and the outbound vacuum/atmospheric transition module may be the same module, with increasing or decreasing vacuum and commensurately decreasing or increasing atmospheric pressure depending upon whether the substrate is being transferred into or out of the pre-treatment chamber.

Figure 6B:
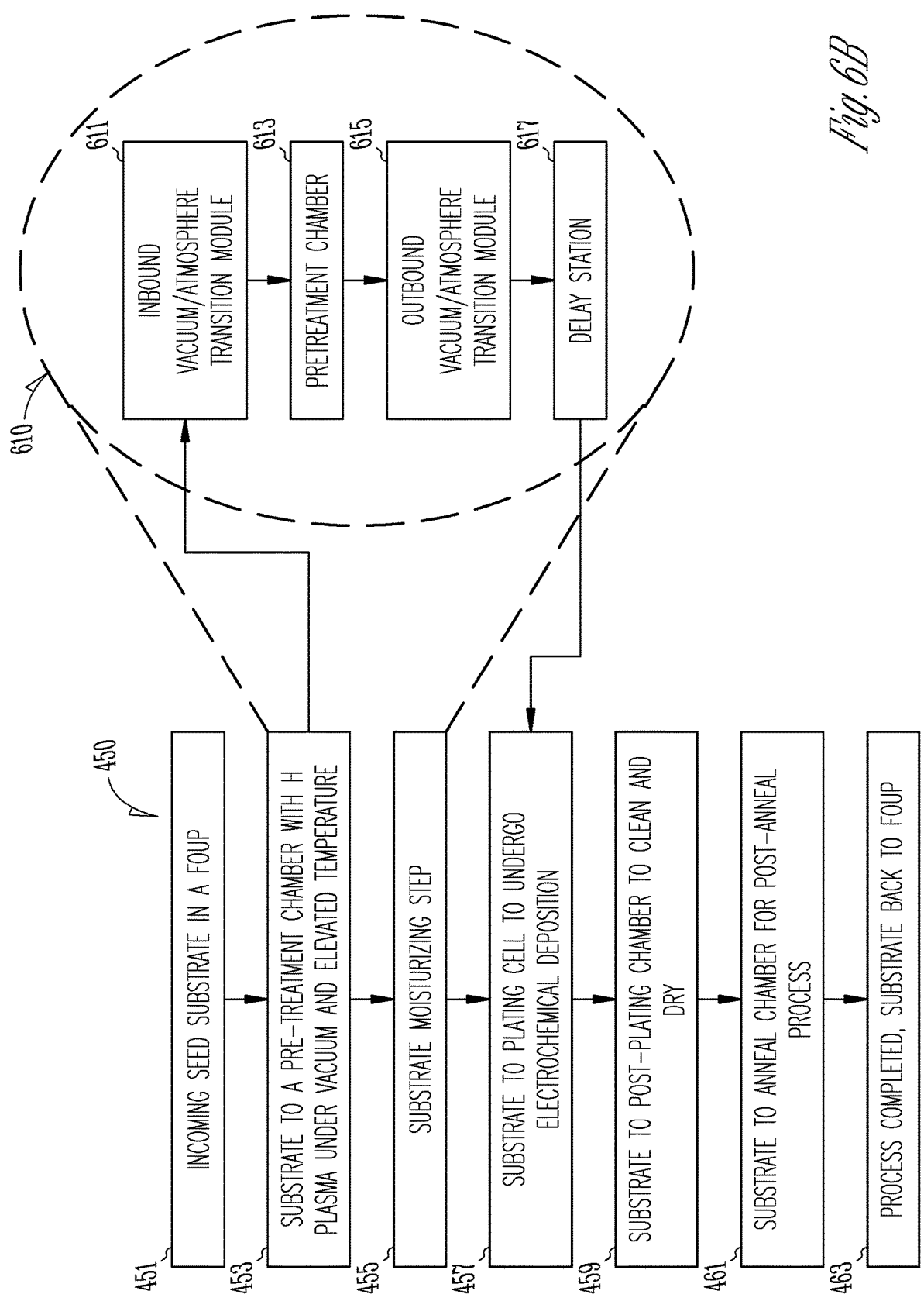
FIG. 6B shows an exemplary embodiment for environmental control of the substrate in a delay-station module.

FIG. 6B shows an exemplary embodiment for environmental control of the substrate in a delay-station module. With concurrent reference again to FIG. 4D, the additional exemplary method 610 of FIG. 6B includes an operation 611 in which the substrate is transferred to an inbound vacuum/atmospheric transition module. The substrate is then transferred, at operation 613, to a pre-treatment chamber. In various embodiments, the pre-treatment chamber may comprise an $H_2$-plasma process under vacuum as noted above. For example, various operational parameters may be similar to or the same as those discussed above with reference to FIG. 6A.

After a delay in the pre-treatment chamber at operation 613, the substrate is transferred to an outbound vacuum/atmospheric transition module at operation 615. The substrate remains in the outbound vacuum/atmospheric transition module for a period of time to transition from the vacuum conditions of the pre-treatment chamber to approximately atmospheric pressure. After the brief delay in the outbound vacuum/atmospheric transition module, the substrate is transferred to a delay station at operation 617.

At least a portion of the moisturizing step at operation 455 occurs in the delay station. For example, in a specific exemplary embodiment, A humidified-$N_2$ environment is supplied to the substrate to increase $H_2O$ vapor adsorption on a surface of the substrate. As disclosed above with reference to FIG. 6A, the $H_2O$ adsorption may be facilitated by a hydroxide layer, with a partial pressure of $H_2O$ being in a similar range to that disclosed above with reference to FIG. 6A. In this embodiment, the relative humidity may be in a range of, for example, from about 20% to about 99%. A flowrate of the $N_2$ is in a range of, for example, from about 1 standard cubic meters per hour (SCMH) to about 200 SCMH, although other flowrates may be suitable. In various embodiments, the substrate may be rotated at a rotational rate of, for example, from about 0 revolutions per minute (RPM) to about 1300 RPM so as to have the $H_2O$ vapor adsorb onto the surface of the substrate more evenly. The substrate then may remain in the delay station for about 1 second to about 1200 seconds.

After the delay time in the delay station at operation 617, the substrate is transferred back to the plating cell at operation 457. Upon reading and understanding the disclosed subject matter, a person of ordinary skill in the art will recognize that the inbound and the outbound vacuum/atmospheric transition module may be the same module, with increasing or decreasing vacuum and commensurately decreasing or increasing atmospheric pressure depending upon whether the substrate is being transferred into the pre-treatment chamber or out of the delay station, respectively.

Although the additional processes of FIGS. 6A and 6B have been described with reference to FIG. 4D, a person of ordinary skill in the art will recognize that the processes may be applied to the method of FIG. 4C as well. Additionally, the additional processes of FIGS. 6A and 6B may comprise a separate, standalone procedure.

Figure 7A:
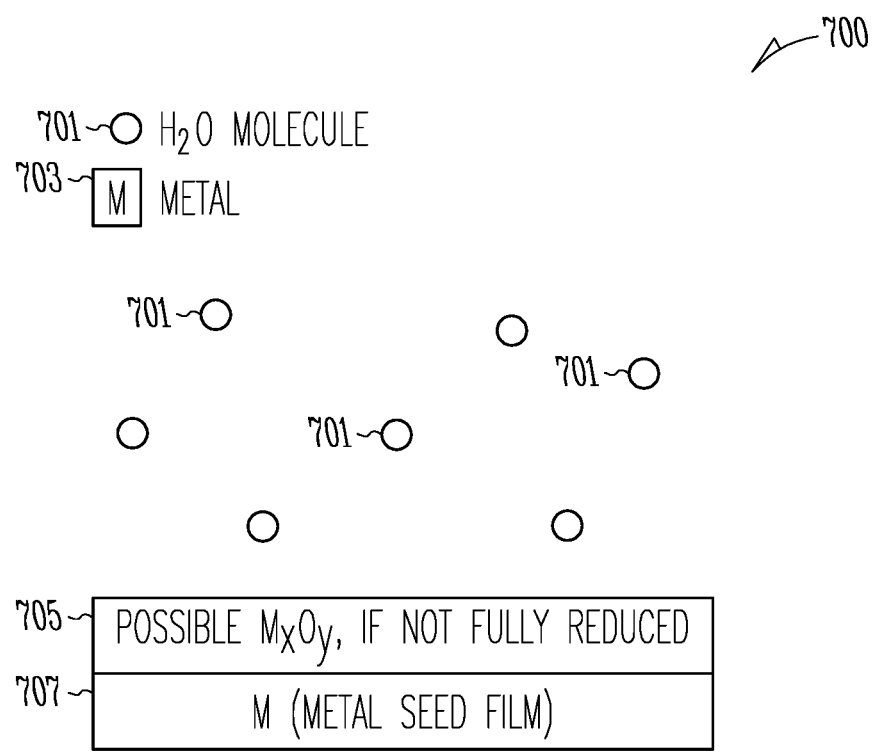
FIG. 7A, an illustration of a prior art sequence in which a surface of a substrate is stripped or substantially stripped of previously-adsorbed $H_2O$ molecules from a metal layer.

With reference now to FIG. 7A, an illustration of a prior art sequence 700 in which a surface of a substrate is stripped or substantially stripped of previously-adsorbed $H_2O$ molecules from a metal layer 703 (such as Co, Cu, W or other metals known in the art). For example, a metal seed-film layer 707 has a possible metal oxide ($M_xO_y$) layer 705 if the metal seed-film layer 707 is not fully reduced. The stripped or substantially stripped $H_2O$ molecules results in poor wettability performance during a subsequent electroplating process as described above, thereby leading to killer defects on the surface of the substrate (e.g., see the defect maps of FIGS. 1A and 1B).

Figure 7B:
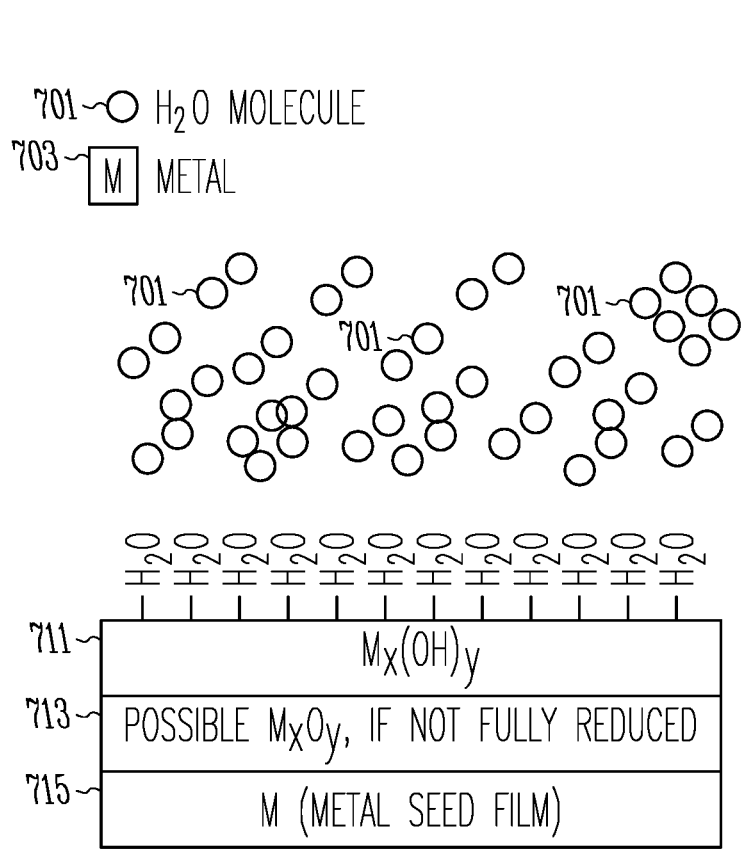
FIG. 7B shows adsorption of $H_2O$ molecules on a surface 710 of a substrate.

In comparison with FIG. 7A, FIG. 7B shows adsorption of $H_2O$ molecules on a surface 710 of a substrate having a metal-seed film layer 715 and a possible metal oxide ($M_xO_y$) layer 713 if the metal-seed film layer 715 is not fully reduced. However, the possible metal oxide ($M_xO_y$) layer 713 now has a metal hydroxide $M_x(OH)_y$ layer 711 formed over the possible metal oxide ($M_xO_y$) layer 713 as a result of at least some of the process steps described herein. Consequently, as disclosed in various embodiments described above, the surface of the substrate is now remoisturized with gaseous $H_2O$ molecule adsorption (as disclosed in exemplary embodiments above regarding humidity levels, temperatures, gas flows, times, etc.). The adsorption of the $H_2O$ molecules, in certain embodiments, may also be facilitated by the formation of the metal hydroxide $M_x(OH)_y$ layer 711 on the surface of the substrate. As noted above, the adsorption of the $H_2O$ molecules significantly improves the wettability of the substrate and therefore leads to excellent defect performance (e.g., see the defect map of FIG. 5).

Consequently, based on the disclosed subject matter in the various embodiments shown and described herein, the wettability of the substrate has been found, during an electrochemical plating process, to be related to the oxide or oxides (e.g., metal oxides) on the surface of the substrate. Consequently, it is generally expected that a seed substrate with minimal surface oxide would show good wettability as compared to a seed substrate with one or more surface oxide layers. Thus, an $N_2$ environment FOUP, and/or a pre-anneal process, and/or an exposure to $H_2$ plasma prior to the plating step, and/or a moisturizing step, are all expected to improve the wettability of a substrate during an immersion process. The disclosed subject matter reveals the importance of surface moisture to the wetting process. It is observed instead that any process that removes surface moisture from substrate prior to plating would generate a wettability issue in a subsequent plating-process. Thus, moisturizing the substrate surface prior to plating can assist in enabling those processes for their benefits (e.g., reducing or removing a surface oxide or oxides).

Also, a person of ordinary skill in the art, upon reading and understanding the disclosure provided herein, will recognize that the moisturizing process step disclosed herein is significantly different from an operation of a pre-wetting process step or condensation of vaporized liquid onto the substrate operations that have been discussed elsewhere in the prior art. As described herein, a pre-wet process, or excessive water from condensation, would impact a subsequent plating performance inside the features. Therefore, these operations of the prior art will not function as effectively for the applications discussed in this disclosure. The disclosed subject matter is therefore to moisturize the substrate with water-vapor adsorption (in a gaseous phase), which may be facilitated via, for example, a metal hydroxide monolayer or layers, to achieve wettability improvement, while avoiding the condensation that could corrode the seed as has been practiced in the prior art. The metal hydroxide monolayer or layers can also facilitate water absorption onto a surface of a metal film.

In general, substantial efforts had been placed on improving substrate wettability during the immersion step of the electrochemical plating process in the prior art, with emphasis on (1) optimizing the immersion movement speed and rotation generally referred to as "entry profile"); and (2) reducing the surface tension of the plating solution. While those two approaches had been found to improve wettability to some extent, these approaches posed constraints to the plating hardware on the plating apparatus, and reduced the process margins that are needed for high volume manufacturing environment.

Therefore, the disclosed subject matter provides a substantial improvement to the wettability issue, which in some applications, could not be resolved fully by changing the plating bath properties, or by changing an entry profile of the substrate.

With any of the implementations disclosed herein, a person of ordinary skill in the art, upon reading and understanding the disclosure and embodiments provided, will recognize that gaseous-phase water vapor absorption onto the surface of a substrate can be determined through governing equations of thermodynamics by considerations of, for example, relative humidity, partial pressures, temperatures, and so on. Varying one or more of the parameters can be modified to control overall defect performance parameters for, for example, a given device type to increase yield and device performance (see, e.g., the defect maps of FIG. 5 in comparison with the defect maps of FIGS. 1A and 1B that are related to prior art methods).

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other particulate matter sensor calibration system embodiments discussed herein. For example, although various embodiments of methods, operations, and processes have been described, these methods, operations, and processes may be used either separately or in various combinations. Consequently, more than one type of moisturizing operation may be performed through various iterations of plating processes or at different stages in a plating operation. A person of ordinary skill in the art, upon reading and understanding the disclosure provided herein, will further recognize that the various metal seed films discussed herein may include but are not limited to, for example, cobalt (Co), copper (Cu), and tungsten (W).

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method to reduce oxidation and increase wettability of a substrate, the method comprising:
   placing the substrate in an oxygen-free, deionized (DI)-moisturized substrate environment for a predetermined amount of time, the substrate environment comprising nitrogen;
   performing a moisturizing operation on the substrate, the moisturizing operation comprising:
   placing the substrate in a pre-treatment chamber, including subjecting the substrate to a hydrogen, plasma-based process under vacuum;
   subsequent to the hydrogen, plasma-based process; placing the substrate in a vacuum-to-atmospheric transition module; and
   supplying water vapor to the vacuum-to-atmospheric transition module to increase water-vapor adsorption on a surface of the substrate;
   performing a plating operation on the substrate; and
   subsequent to performing the plating operation on the substrate, post-annealing the substrate in an anneal chamber during a post-anneal process.

2. The method of claim 1, wherein the substrate includes a metal-seed layer formed thereon.

3. The method of claim 1, wherein the substrate environment is a front-opening, unified pod (FOUP).

4. The method of claim 1, further comprising controlling a relative-humidity (RH) range within the substrate environment in a range of between about 20% and about 100%.

5. The method of claim 1, wherein the plating operation comprises an electrochemical deposition.

6. The method of claim 1, further comprising performing cleaning and drying of the substrate in a post-plating chamber.

7. The method of claim 1, wherein the post-anneal process comprises:
 annealing the substrate at a temperature range of from about 30° C. to about 400° C. for between about 30 seconds to about 600 seconds; and
 cooling the substrate for between about 30 seconds and about 600 seconds.

8. A method to reduce oxidation and increase wettability of a substrate, the method comprising:
 placing the substrate in a nitrogen-based substrate environment for a predetermined amount of time;
 performing a moisturizing operation on the substrate;
 the moisturizing operation comprising:
 placing the substrate in a pre-treatment chamber, including subjecting the substrate to a hydrogen, plasma-based process under vacuum;
 subsequent to the hydrogen, plasma-based process, placing the substrate in a vacuum-to-atmospheric transition module for a predetermined period of time to transition from vacuum conditions of the pre-treatment chamber to approximately atmospheric pressure;
 placing the substrate in a delay station; and
 supplying water vapor to the delay station to increase water-vapor adsorption on a surface of the substrate;
 performing a plating operation on the substrate; and
 subsequent to performing the plating operation on the substrate, post-annealing the substrate in an anneal chamber during a post-anneal process.

9. The method of claim 8, wherein the moisturizing operation further comprises rotating the substrate subsequent to placing the substrate in the delay station.

10. The method of claim 8, further comprising facilitating the water-vapor adsorption by forming a hydroxide layer on a surface of the substrate.

11. The method of claim 9, wherein a rotational rate of the substrate is between 0 revolutions per minute (RPM) and about 1300 RPM.

12. The method of claim 8, wherein the substrate includes a metal-seed layer formed thereon.

13. The method of claim 8, wherein the plating operation comprises an electrochemical deposition.

14. A method to reduce oxidation and increase wettability of a substrate, the method comprising:
 placing the substrate in a substrate environment for a predetermined amount of time;
 performing a pre-anneal process on the substrate with a forming gas including hydrogen;
 subsequent to the pre-anneal process, performing a moisturizing operation on the substrate;
 the moisturizing operation comprising:
 placing the substrate in a pre-treatment chamber, including subjecting the substrate to a hydrogen, plasma-based process under vacuum;
 subsequent to the hydrogen, plasma-based process;
 placing the substrate in a vacuum-to-atmospheric transition module; and
 supplying water vapor to the vacuum-to-atmospheric transition module to increase water-vapor adsorption on a surface of the substrate;
 performing a plating operation on the substrate; and
 subsequent to performing the plating operations on the substrate, post-annealing the substrate in an anneal chamber during a post-anneal process.

15. The method of claim 14, wherein the moisturizing operation further comprises placing the substrate in a delay station including rotating the substrate prior to the plating operation, the delay station being located in the pre-treatment chamber.

16. The method of claim 14, further comprising facilitating the water-vapor adsorption by forming a hydroxide layer on a surface of the substrate.

17. The method of claim 15, wherein a rotational rate of the substrate is between 0 revolutions per minute (RPM) and about 1300 RPM.

18. The method of claim 14, wherein the substrate includes a metal-seed layer formed thereon.

19. The method of claim 14, wherein the pre-anneal process and the post-anneal process each comprise:
 annealing the substrate at a temperature range of between about 30° C. and about 400° C. for between about 30 seconds and about 600 seconds; and
 cooling the substrate for between about 30 seconds and about 600 seconds.

20. A method to reduce oxidation and increase wettability of a substrate, the method comprising:
 placing the substrate in a substrate environment for a predetermined amount of time, the substrate environment comprising at least one of nitrogen and hydrogen;
 performing a pre-treatment process on the substrate, the pre-treatment process including a hydrogen-plasma under vacuum at an elevated temperature, during a hydrogen-plasma process;
 subsequent to performing the hydrogen-plasma process on the substrate, performing a moisturizing operation on the substrate;
 the moisturizing operation comprising:
 placing the substrate in a pre-treatment chamber, including subjecting the substrate to a hydrogen, plasma-based process under vacuum;
 subsequent to the hydrogen, plasma-based process;
 placing the substrate in a vacuum-to-atmospheric transition module; and
 supplying water vapor to the vacuum-to-atmospheric transition module to increase water-vapor adsorption on a surface of the substrate;
 performing a plating operation on the substrate; and
 subsequent to performing the plating operations on the substrate, post-annealing the substrate in an anneal chamber during a post-anneal process.

21. The method of claim 20, wherein the moisturizing operation further comprises:
 placing the substrate in a delay station including rotating the substrate prior to the plating operation, the delay station being located in the pre-treatment chamber.

22. The method of claim 21, further comprising facilitating the water-vapor adsorption by forming a hydroxide layer on the substrate.

23. The method of claim 21, wherein a rotational rate of the substrate is between 0 revolutions per minute (RPM) and about 1300 RPM.

24. The method of claim 20, wherein the substrate includes a metal-seed layer formed thereon.

25. The method of claim 20, wherein the post-anneal process each comprises:
- annealing the substrate at a temperature range of between about 30° C. and about 400° C. for between about 30 seconds and about 600 seconds; and
- cooling the substrate for between about 30 seconds and about 600 seconds.

26. A method to control substrate wettability, the method comprising:
- placing a substrate in a pre-treatment chamber, the pre-treatment chamber comprising at least one gas selected from nitrogen and hydrogen;
- subjecting the substrate to a hydrogen, plasma-based process under vacuum;
- subsequent to the hydrogen, plasma-based process;
- placing the substrate in a vacuum-to-atmospheric transition module;
- supplying water vapor to the vacuum-to-atmospheric transition module to increase water-vapor adsorption on a surface of the substrate; and
- controlling an environment of the pre-treatment chamber to moisturize a surface of the substrate, the moisturizing not adding an oxidizing layer on the surface of the substrate.

* * * * *